(12) United States Patent  
Chen et al.

(10) Patent No.: US 8,815,677 B2  
(45) Date of Patent: Aug. 26, 2014

(54) METHOD OF PROCESSING MIM CAPACITORS TO REDUCE LEAKAGE CURRENT

(75) Inventors: Hanhong Chen, San Jose, CA (US); Wim Deweerd, San Jose, CA (US); Xiangxin Rui, Campbell, CA (US); Sandra Malhotra, San Jose, CA (US); Hiroyuki Ode, Hiroshima (JP)

(73) Assignees: Intermolecular, Inc., San Jose, CA (US); Elpida Memory, Inc., Tokyo (JP)

( * ) Notice: Subject to any disclaimer, the term of this patent is extended or adjusted under 35 U.S.C. 154(b) by 359 days.

(21) Appl. No.: 13/159,842

(22) Filed: Jun. 14, 2011

(65) Prior Publication Data

US 2012/0322220 A1     Dec. 20, 2012

(51) Int. Cl.
*H01L 21/8242*     (2006.01)
*H01L 21/20*     (2006.01)

(52) U.S. Cl.
USPC ........... 438/239; 438/244; 438/253; 438/387; 438/396; 257/E21.008; 257/E21.011; 257/E21.647; 257/E21.648

(58) Field of Classification Search
USPC ......................... 438/239, 244, 253, 387, 396; 257/E21.008, E21.011, E21.647, 257/E21.648
See application file for complete search history.

(56) References Cited

U.S. PATENT DOCUMENTS

| | | | |
|---|---|---|---|
| 5,933,316 A | 8/1999 | Ramakrishnan et al. | |
| 6,096,597 A | 8/2000 | Tsu et al. | |
| 6,197,650 B1 | 3/2001 | Wu | |
| 6,479,849 B1 | 11/2002 | Katori | |
| 8,288,756 B2 * | 10/2012 | Adhikari et al. | 257/18 |
| 2007/0138529 A1 * | 6/2007 | Basceri et al. | 257/301 |
| 2009/0065850 A1 * | 3/2009 | Oh et al. | 257/324 |
| 2010/0066440 A1 * | 3/2010 | Juengling | 327/537 |
| 2011/0000875 A1 | 1/2011 | Antonov et al. | |

FOREIGN PATENT DOCUMENTS

EP     1087426 A2     3/2001
WO     2011002603 A3     1/2011

OTHER PUBLICATIONS

Lim, H., et al; Leakage current improvement of doped and bi-layer high-k for MIM capacitor; 2010; Samsung Electronics Co., Ltd.; Abstract #1522, 218th ECS Meeting, The Electromechanical Society.

Kittl, J.A., et al.; High-k Dielectrics and Metal Gates for Future Generation Memory Devices; 2009; ECS Transactions, The Electromechanical Society, pp. 29-40.

Kil, D., et al.; Improvement of Leakage Current Property of TIT Capacitor with Compositionally Stepped HfxAlyOz Thin Films; 2006; Hynix Semiconductor Inc.; Electronic Materials Letters, vol. 2, No. 1, pp. 15-18.

Liu, Y., et al.; Effects of Low Temperature O2 Treatment on the Electrical Properties of Amorphous LaAlO3 Films Made by Atomic Layer Deposition; 2008; ECS Transactions, The Electromechanical Society, pp. 471-478.

* cited by examiner

*Primary Examiner* — Mohsen Ahmadi (57) ABSTRACT

A method for processing dielectric materials and electrodes to decrease leakage current is disclosed. The method includes a post dielectric anneal treatment in an oxidizing atmosphere to reduce the concentration of oxygen vacancies in the dielectric material. The method further includes a post metallization anneal treatment in an oxidizing atmosphere to reduce the concentration of interface states at the electrode/dielectric interface and to further reduce the concentration of oxygen vacancies in the dielectric material.

14 Claims, 7 Drawing Sheets

METHOD OF PROCESSING MIM CAPACITORS TO REDUCE LEAKAGE CURRENT

This document relates to the subject matter of a joint research agreement between Intermolecular, Inc. and Elpida Memory, Inc.

FIELD OF THE INVENTION

The present invention relates to semiconductor device manufacturing processes, and more specifically to processing of dielectrics and electrodes for capacitors used in dynamic random access memory (DRAM) devices.

BACKGROUND OF THE INVENTION

Dynamic Random Access Memory (DRAM) utilizes capacitors to store bits of information within an integrated circuit. A capacitor is formed by placing a dielectric material between two electrodes formed from conductive materials. A capacitor's ability to hold electrical charge (i.e., capacitance) is a function of the surface area of the capacitor plates A, the distance between the capacitor plates d (i.e. the physical thickness of the dielectric layer), and the relative dielectric constant or k-value of the dielectric material. The capacitance is given by $$C = \kappa \varepsilon_o \frac{A}{d} \quad \text{(Eqn. 1)}$$

where $\varepsilon_o$ represents the vacuum permittivity.

The dielectric constant is a measure of a material's polarizability. Therefore, the higher the dielectric constant of a material, the more charge the capacitor can hold. Therefore, if the k-value of the dielectric is increased, the area of the capacitor can be decreased and maintain the desired cell capacitance. Reducing the size of capacitors within the device is important for the miniaturization of integrated circuits. This allows the packing of millions (mega-bit (Mb)) or billions (giga-bit (Gb)) of memory cells into a single semiconductor device. The goal is to maintain a large cell capacitance (generally ~10 to 25 fF) and a low leakage current (generally <$10^{-7}$ A cm$^{-2}$). The physical thickness of the dielectric layers in DRAM capacitors could not be reduced unlimitedly in order to avoid leakage current caused by tunneling mechanisms (as more fully described below) which exponentially increases as the thickness of the dielectric layer decreases.

Traditionally, SiO$_2$ has been used as the dielectric material and semiconducting materials (semiconductor-insulator-semiconductor [SIS] cell designs) have been used as the electrodes. The cell capacitance was maintained by increasing the area of the capacitor using very complex capacitor morphologies while also decreasing the thickness of the SiO$_2$ dielectric layer. Increases of the leakage current above the desired specifications have demanded the development of new capacitor geometries, new electrode materials, and new dielectric materials. Cell designs have migrated to metal-insulator-semiconductor (MIS) and now to metal-insulator-metal (MIM) cell designs for higher performance.

Typically, DRAM devices at technology nodes of 80 nm and below use MIM capacitors wherein the electrode materials are metals. These electrode materials generally have higher conductivities than the semiconductor electrode materials, higher work functions, exhibit improved stability over the semiconductor electrode materials, and exhibit reduced depletion effects. The electrode materials must have high conductivity to ensure fast device speeds. Representative examples of electrode materials for MIM capacitors are metals, conductive metal oxides, conductive metal silicides, conductive metal nitrides (i.e. TiN), or combinations thereof. MIM capacitors in these DRAM applications utilize insulating materials having a dielectric constant, or k-value, significantly higher than that of SiO$_2$ (k=3.9). For DRAM capacitors, the goal is to utilize dielectric materials with k values greater than about 40. Such materials are generally classified as high-k materials. Representative examples of high-k materials for MIM capacitors are non-conducting metal oxides, non-conducting metal nitrides, non-conducting metal silicates or combinations thereof. These dielectrics may also include additional dopant materials.

A figure of merit in DRAM technology is the electrical performance of the dielectric material as compared to SiO$_2$ known as the Equivalent Oxide Thickness (EOT). A high-k material's EOT is calculated using a normalized measure of silicon dioxide (SiO$_2$ k=3.9) as a reference, given by:

$$EOT = \frac{3.9}{\kappa} \cdot d \quad \text{(Eqn. 2)}$$

where d represents the physical thickness of the capacitor dielectric.

As DRAM technologies scale below the 40 nm technology node, manufacturers must reduce the EOT of the high-k dielectric films in MIM capacitors in order to increase charge storage capacity. The goal is to utilize dielectric materials that exhibit an EOT of less than about 0.8 nm while maintaining a physical thickness of about 5-20 nm.

One class of high-k dielectric materials possessing the characteristics required for implementation in advanced DRAM capacitors are high-k metal oxide materials. Titanium dioxide (TiO$_2$) and zirconium dioxide (ZrO$_2$) are two metal oxide dielectric materials which display significant promise in terms of serving as high-k dielectric materials for implementation in DRAM capacitors. Other metal oxide high-k dielectric materials that have attracted attention include HfO$_2$, Al$_2$O$_3$, Ta$_2$O$_5$, etc.

Generally, as the dielectric constant of a material increases, the band gap of the material decreases. This contributes to high leakage current in the device. As a result, without the utilization of countervailing measures, capacitor stacks implementing high-k dielectric materials may experience large leakage currents. High work function electrodes (e.g., electrodes having a work function of greater than 5.0 eV) may be utilized in order to counter the effects of implementing a reduced band gap high-k dielectric layer within the DRAM capacitor. Metals, such as platinum, gold, ruthenium, and ruthenium oxide are examples of high work function electrode materials suitable for inhibiting device leakage in a DRAM capacitor having a high-k dielectric layer. The noble metal systems, however, are prohibitively expensive when employed in a mass production context. Moreover, electrodes fabricated from noble metals often suffer from poor manufacturing qualities, such as surface roughness and form a contamination risk in the fab.

Conductive metal oxides, conductive metal silicides, conductive metal nitrides, or combinations thereof comprise other classes of materials that may be suitable as DRAM capacitor electrodes. Generally, transition metals and their conductive binary compounds form good candidates as electrode materials. The transition metals exist in several oxidation states. Therefore, a wide variety of compounds are possible. Different compounds may have different crystal structures, electrical properties, etc. It is important to utilize the proper compound for the desired application. Conductive metal nitrides such as TiN, TaN, WN, etc. have attracted interest as DRAM capacitor electrodes with TiN being the most popular.

Generally, a deposited thin film may be amorphous, crystalline, or a mixture thereof. Furthermore, several different crystalline phases may exist. Therefore, processes (both deposition and post-treatment) must be developed to maximize the properties of the electrode and dielectric materials. The electrode and dielectric materials may be deposited using any common deposition technique such as atomic layer deposition (ALD), plasma enhanced atomic layer deposition (PE-ALD), atomic vapor deposition (AVP), ultraviolet assisted atomic layer deposition (UV-ALD), chemical vapor deposition (CVD), plasma enhanced chemical vapor deposition (PECVD), or physical vapor deposition (PVD). Because of the complex morphology of typical DRAM capacitor structures, ALD, PE-ALD, AVD, or CVD techniques are most often used.

Leakage current in capacitor dielectric materials can be due to Schottky emission, Frenkel-Poole defects (e.g. oxygen vacancies ($V_{ox}$)), or Fowler-Nordheim tunneling. Schottky emission, also called thermionic emission, is a common mechanism and is the heat-induced flow of charge over an energy barrier whereby the effective barrier height of a MIM capacitor controls leakage current. Effective barrier height is a function of the difference between the work function of the electrode and the electron affinity of the dielectric. Electron affinity of a dielectric is closely related to the conduction band offset of the dielectric. The Schottky emission behavior of a dielectric layer is generally determined by the properties of the dielectric/electrode interface. Frenkel-Poole emission allows the conduction of charges through a dielectric layer through the interaction with defect sites such as vacancies and the like. As such, the Frenkel-Poole emission behavior of a dielectric layer is generally determined by the dielectric layer's bulk properties. Fowler-Nordheim emission allows the conduction of charges through a dielectric layer through tunneling. As such, the Fowler-Nordheim emission behavior of a dielectric layer is generally determined by the physical thickness of the dielectric layer. This leakage current is a primary driving force in the adoption of high k dielectric materials. The use of high k materials allows the physical thickness of the dielectric layer may be as thick as possible while maintaining the required capacitance (see Eqn 1 above).

Therefore, a need exists to develop electrode and dielectric material systems that minimize the Schottky emission and Frenkel-Poole emission conduction mechanisms with DRAM capacitors. The Fowler-Nordheim emission conduction mechanism (i.e. tunneling) can be addressed by selecting a material with a high dielectric constant (high-k) resulting in the use of dielectric layers with an adequate physical thickness.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

It is to be understood that both the foregoing general description and the following detailed description are exemplary and explanatory only and are not restrictive of the invention as claimed. The accompanying drawings, which are incorporated in and constitute a part of the specification, illustrate embodiments of the invention and together with the general description, serve to illustrate the principles of the invention. Reference will now be made in detail to the subject matter disclosed, which is illustrated in the accompanying drawings.

Figure 1:
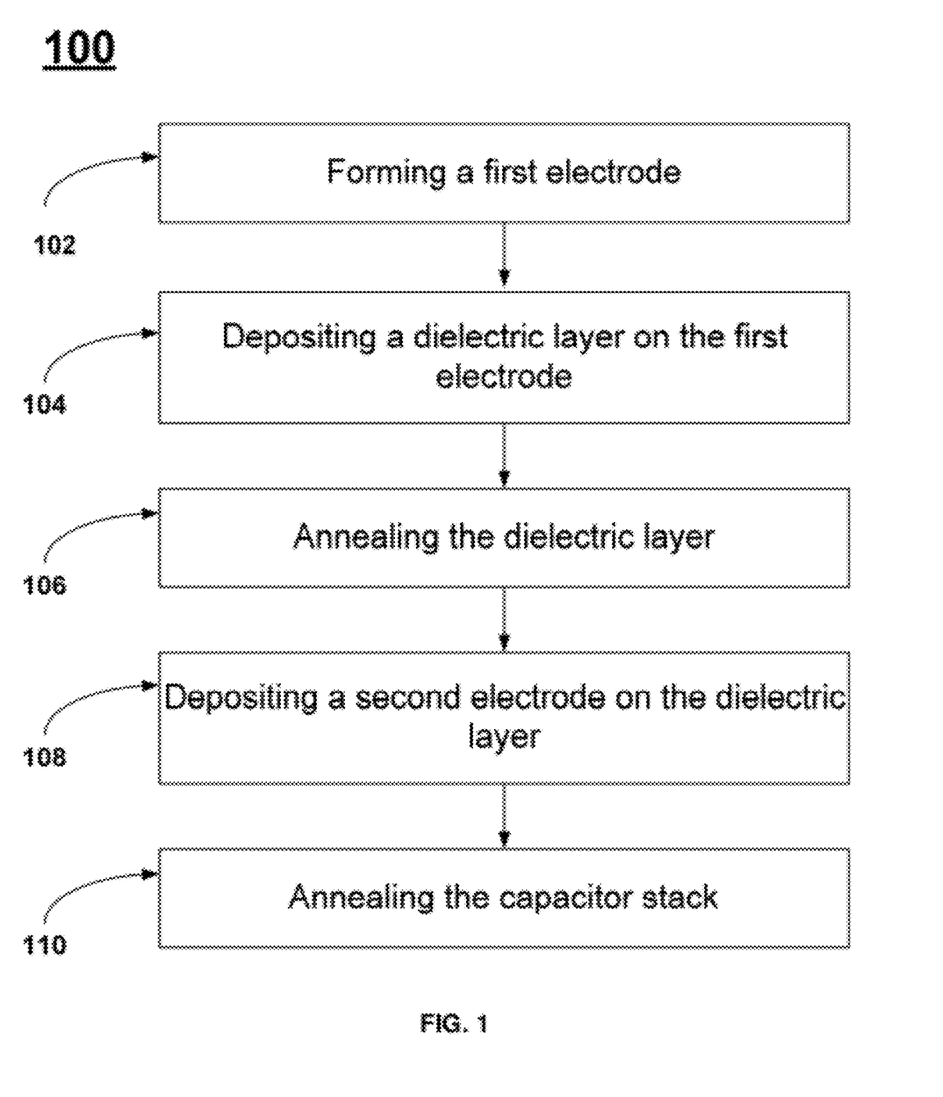
FIG. 1 illustrates a flow chart illustrating a method for fabricating a DRAM capacitor stack in accordance with some embodiments of the present invention.

FIG. 1 describes a method, 100, for fabricating a DRAM capacitor stack. The initial step, 102, comprises forming a first electrode layer on a substrate. Examples of suitable electrode materials comprise conductive metal oxides, conductive metal silicides, conductive metal nitrides, and combinations thereof. A particularly interesting class of materials is the conductive metal oxides. Generally, deposited thin films of these conductive metal oxide materials also contain oxygen-rich components. Optionally, the first electrode layer can be subjected to an annealing process (not shown). The next step, 104, comprises forming a dielectric material on the first electrode layer. The next step, 106, comprises annealing the dielectric material in an oxidizing atmosphere. This step is also known as a post dielectric anneal (PDA) treatment. As used herein, an oxidizing atmosphere is one where further oxidation of the material is promoted by an oxidizing gas such as $O_2$, $O_3$, $H_2O$, $N_2O$, $H_2O_2$, etc. present as a mixture in an inert gas such as $N_2$ or Ar, etc. The PDA step may use any number of technologies to provide active oxygen species during the anneal. Examples of suitable technologies comprise thermal, plasma, ultraviolet (UV) light with an ozone atmosphere (UV-$O_3$), Rapid Thermal Oxidation (RTO), etc. Those skilled in the art will appreciate that the teachings described below are not limited by the technology used for the anneal process.

The next step, 108, comprises forming a second electrode layer on the dielectric layer. At this point, the processing sequence may take one of two paths as illustrated in FIG. 1. In some DRAM process flows, an insulating layer is deposited on top of the second electrode as illustrated in step 110. The next step, 112, comprises annealing the DRAM capacitor stack in an oxidizing atmosphere. Alternatively, in other DRAM process flows, the annealing may be performed after the deposition of the second electrode, but before the deposition of the insulating layer as illustrated in step 114. The insulating layer would then be deposited after the annealing as illustrated in step 116. Regardless of the path 110-112 or 114-116, the annealing takes place after the depositing of the second electrode layer on the dielectric layer in step 108. This annealing is also known as a post metallization anneal (PMA) treatment. The PMA step serves to crystallize the second electrode layer and reduce the interface states that may have formed during the deposition of the second electrode. The PMA step may use any number of technologies to provide active oxygen species during the anneal. Examples of suitable technologies comprise thermal, plasma, ultraviolet (UV) light with an ozone atmosphere, rapid thermal oxidation (RTO), etc. Those skilled in the art will appreciate that the teachings described below are not limited by the technology used for the anneal process.

Those skilled in the art will appreciate that each of the first electrode layer, the dielectric layer, and the second electrode layer may be formed using well known techniques such as ALD, PE-ALD, AVD, UV-ALD, CVD, PECVD, or PVD. Generally, because of the complex morphology of the DRAM capacitor structure, ALD, PE-ALD, AVD, or CVD are preferred methods of formation. However, any of these techniques are suitable for forming each of the various layers discussed below. Those skilled in the art will appreciate that the teachings described below are not limited by the technology used for the deposition process.

Figure 2:
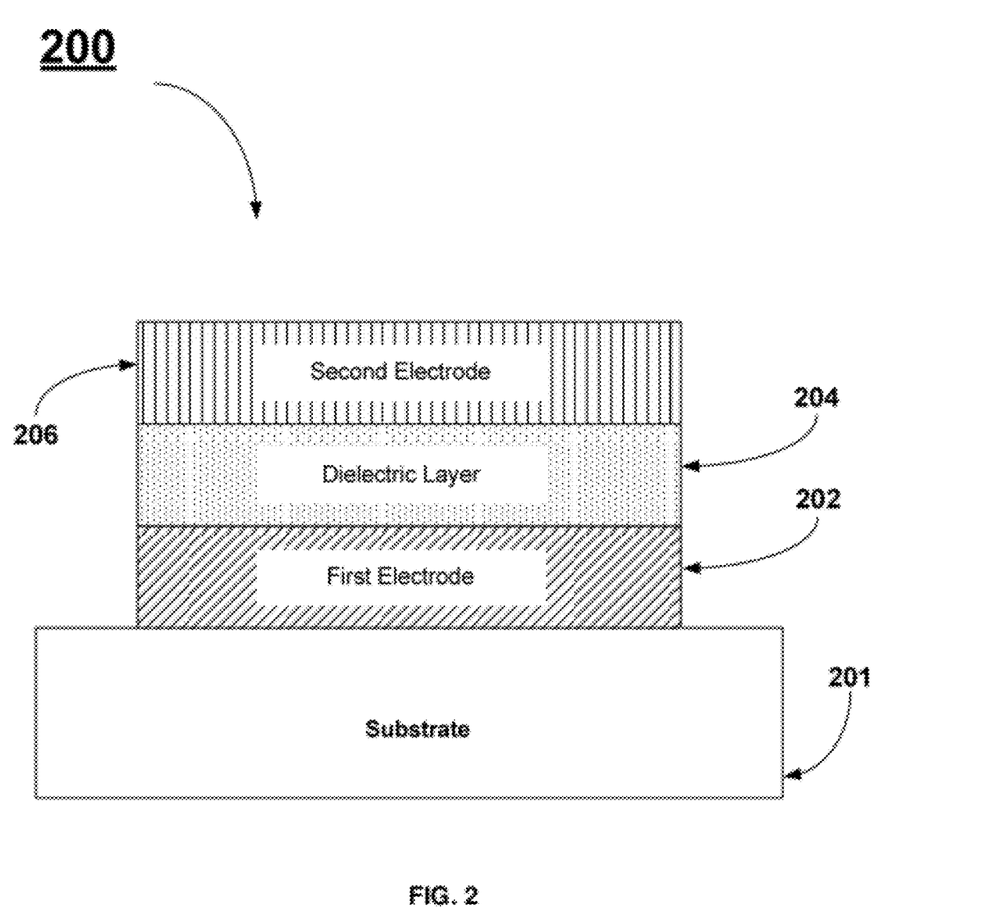
FIG. 2 illustrates a simplified cross-sectional view of a DRAM capacitor stack fabricated in accordance with some embodiments of the present invention.
Figure 4:
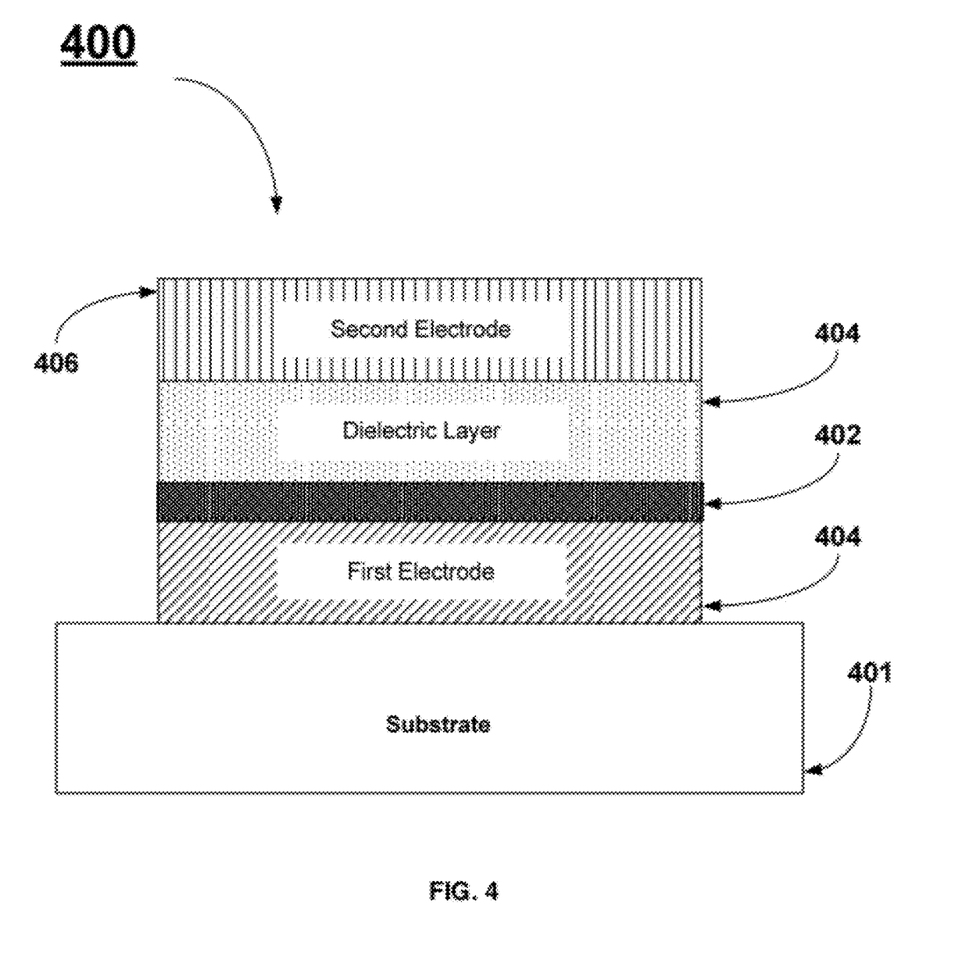
FIG. 4 illustrates a simplified cross-sectional view of a DRAM capacitor stack fabricated in accordance with some embodiments of the present invention.

In FIGS. 2, and 4 below, a capacitor stack is illustrated using a simple planar structure. Those skilled in the art will appreciate that the description and teachings to follow can be readily applied to any simple or complex capacitor morphology. The drawings are for illustrative purposes only and do not limit the application of the present invention.

FIG. 2 illustrates a simple capacitor stack, 200, consistent with some embodiments of the present invention. Using the method as outlined in FIG. 1 and described above, first electrode layer, 202, is formed on substrate, 201. Generally, the substrate has already received several processing steps in the manufacture of a full DRAM device. First electrode layer, 202, comprises a conductive metal oxide material that also contains oxygen-rich components. Examples of the conductive metal oxides include the conductive compounds of molybdenum oxide, tungsten oxide, ruthenium oxide, rhenium oxide, rhodium oxide, iridium oxide, chromium oxide, manganese oxide, tin oxide, cobalt oxide, or nickel oxide. A specific electrode material of interest is the $MoO_2$ compound of molybdenum oxide.

Optionally, the substrate with first electrode layer, 202, would then be annealed. In one example, the first electrode layer, 202, is annealed in a reducing atmosphere to reduce the concentration of the oxygen-rich components. Generally, the reducing atmosphere will comprise $H_2$, or $NH_3$ mixed with an inert gas such as $N_2$ or Ar. Forming gas is a specific example of a reducing atmosphere and is available commercially wherein the $H_2$ concentration can range between about 1 and 25% mixed with $N_2$. One example of such an annealing process is further described in U.S. application Ser. No. 13/084,666 filed on Apr. 12, 2011, entitled "METHOD FOR FABRICATING A DRAM CAPACITOR" and is incorporated herein by reference.

In the next step, dielectric layer, 204, would then be formed on the annealed first electrode layer, 202. A wide variety of dielectric materials have been targeted for use in DRAM capacitors. Examples of suitable dielectric materials comprise $SiO_2$, a bilayer of $SiO_2$ and $Si_xN_y$, SiON, $Al_2O_3$, $HfO_2$, $HfSiO_x$, $ZrO_2$, $Ta_2O_5$, $TiO_2$, $SrTiO_3$ (STO), $SrBaTiO_x$ (SBT), $PbZrTiO_x$ (PZT), or doped versions of the same. These dielectric materials may be formed as a single layer or may be formed as a hybrid or nanolaminate structure. A specific dielectric material of interest is the rutile-phase of doped $TiO_2$.

In the next step, the dielectric layer, 204, would then be annealed in an oxidizing atmosphere (PDA treatment) to ensure that the oxidation of the dielectric material is complete and that any oxygen vacancies ($V_{ox}$) are filled.

The decrease in oxygen vacancies will lower the leakage current contribution from the Frenkel-Poole emission mechanism. Generally, the oxidizing atmosphere will comprise at least one of $O_2$, $O_3$, $H_2O$, $N_2O$, $H_2O_2$, etc. present as a mixture in an inert gas such as $N_2$ or Ar, etc. The use of an oxidizing atmosphere at this step allows the annealing step after the second electrode to be performed in an inert atmosphere or a very dilute oxidizing atmosphere. This decreases the oxidation of the electrode layers.

In the next step, the second electrode layer, 206, is formed on dielectric layer, 204. The second electrode layer may be a conductive binary metal compound material as described above, a metal, or a combination thereof.

In the next step, the DRAM capacitor stack, 200, would then be annealed (PMA treatment) to crystallize the second electrode and ensure that the oxidation state of the dielectric material is not compromised and that any oxygen vacancies ($V_{ox}$) are filled. If the second electrode is a conductive metal oxide, the atmosphere will be oxidizing and will comprise at least one of $O_2$, $O_3$, $H_2O$, $N_2O$, $H_2O_2$, etc. present as a mixture in an inert gas such as $N_2$ or Ar, etc. If the second electrode is a metal or a conductive metal nitride, the atmosphere will be an inert gas such as $N_2$ or Ar.

In one example of the present invention, a first electrode comprising between about 5 nm and about 10 nm of molybdenum oxide is formed on a substrate. The molybdenum oxide electrode material is formed at a process temperature between about 125 C and 400 C using an ALD process technology. Optionally, the substrate with the first electrode is then annealed in a reducing atmosphere comprising between about 1% and about 10% $H_2$ in $N_2$ and advantageously between about 5% and about 10% $H_2$ in $N_2$ at between about 400 C and about 520 C for between about 1 millisecond and about 60 minutes. A dielectric layer is then formed on top of the annealed first electrode. The dielectric layer comprises between about 5 nm to about 10 nm of $TiO_2$ wherein at least 30% of the $TiO_2$ is present in the rutile phase. Optionally, the $TiO_2$ material is doped with $Al_2O_3$ at a concentration between about 5% and about 15% $Al_2O_3$. The $TiO_2$ dielectric layer is formed at a process temperature between about 200 C and 350 C using an ALD process technology. The substrate with the first electrode and dielectric layer is then annealed in an oxidizing atmosphere comprising between about 0% $O_2$ to about 100% $O_2$ in $N_2$ and advantageously between about 0% $O_2$ to about 20% $O_2$ in $N_2$ at temperatures between about 400 C to about 600 C for between about 1 millisecond to about 60 minutes. A second electrode is then formed on top of the dielectric layer. The second electrode comprises between about 5 nm to about 10 nm of $MoO_2$. The $MoO_2$ second electrode layer is formed at a process temperature between about 125 C and 400 C using an ALD process technology. The substrate with the first electrode, dielectric layer, and second electrode (i.e. a capacitor stack) is then annealed in an oxidizing atmosphere comprising between about 0% $O_2$ to about 10% $O_2$ in $N_2$ at between about 400 C to about 550 C for between about 1 millisecond to about 60 minutes. The PMA treatment generally has a lower oxygen concentration to prevent oxidation of the two electrode layers.

Figure 3:
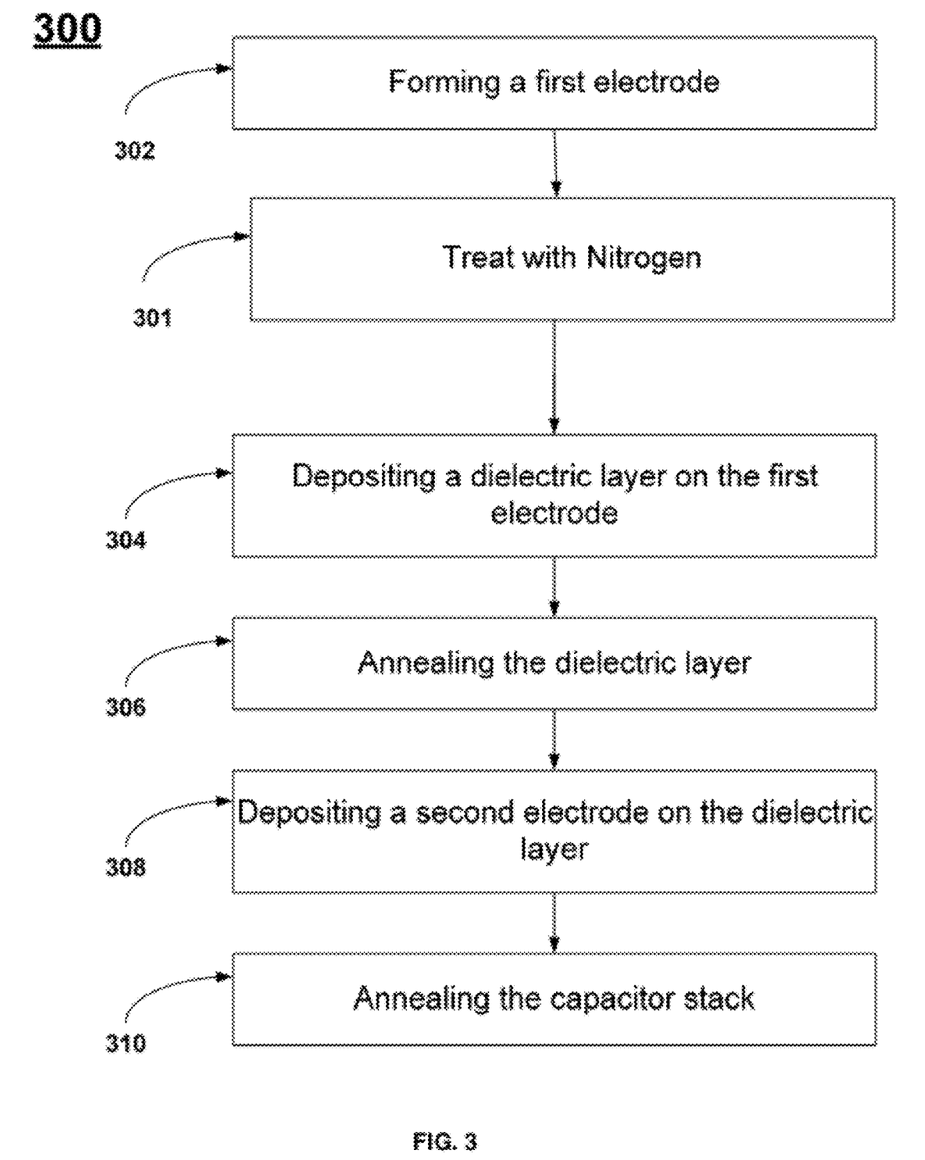
FIG. 3 illustrates a flow chart illustrating a method for fabricating a DRAM capacitor stack in accordance with some embodiments of the present invention.

FIG. 3 describes a method, 300, for fabricating a DRAM capacitor stack. The initial step, 302, comprises forming a first electrode layer on a substrate. Examples of suitable electrode materials comprise conductive metal oxides, conductive metal silicides, conductive metal nitrides, and combinations thereof. A particularly interesting class of materials is the conductive metal nitrides. The next step, 301, is an electrode protection step and comprises the treatment of the electrode surface with an energetic nitrogen treatment. The energy may be supplied thermally, through a plasma, or through a rapid thermal anneal (RTA) process with a nitrogen species. The nitrogen species may be $N_2$, $NH_3$, $N_2O$, etc. Examples of such an electrode protection step are further described in U.S. application Ser. No. 13/051,531 filed on Mar. 18, 2011, and is incorporated herein by reference. Optionally, the first electrode layer can be subjected to an annealing process (not shown). The next step, 304, comprises forming a dielectric material on the first electrode layer. The next step, 306, comprises annealing the dielectric material in an oxidizing atmosphere. The next step, 308, comprises forming a second electrode layer on the dielectric layer. At this point, the processing sequence may take one of two paths as illustrated in FIG. 3. In some DRAM process flows, an insulating layer is deposited on top of the second electrode as illustrated in step 310. The next step, 312, comprises performing a PMA step by annealing the DRAM capacitor stack in an oxidizing atmosphere. Alternatively, in other DRAM process flows, the annealing may be performed after the deposition of the second electrode, but before the deposition of the insulating layer as illustrated in step 314. The insulating layer would then be deposited after the annealing as illustrated in step 316.

FIG. 4 illustrates a simple capacitor stack, 400, consistent with some embodiments of the present invention. Using the method as outlined in FIG. 3 and described above, first electrode layer, 404, is formed on substrate, 401. Generally, the substrate has already received several processing steps in the manufacture of a full DRAM device. First electrode layer, 404, comprises a conductive metal nitride material. Examples of the conductive metal nitrides include TiN, TaN, WN, and others. A specific electrode material of interest is TiN.

First electrode layer, 404, then receives an energetic nitrogen treatment (step 301). The surface of the first electrode is thus altered in some manner as indicated by layer 402 in FIG. 4.

In the next step, dielectric layer, 404, would then be formed on the annealed first electrode layer, 404/402. A wide variety of dielectric materials have been targeted for use in DRAM capacitors. Examples of suitable dielectric materials comprise $SiO_2$, a bilayer of $SiO_2$ and $Si_xN_y$, SiON, $Al_2O_3$, $HfO_2$, $HfSiO_x$, $ZrO_2$, $Ta_2O_5$, $TiO_2$, $SrTiO_3$ (STO), $SrBaTiO_x$ (SBT), $PbZrTiO_x$ (PZT) or doped versions of the same. These dielectric materials may be formed as a single layer or may be formed as a hybrid or nanolaminate structure. A specific dielectric material of interest is $ZrO_2$.

In the next step, the dielectric layer, 404, would then be annealed in an oxidizing atmosphere (PDA treatment) to ensure that the oxidation of the dielectric material is complete and that any oxygen vacancies ($V_{ox}$) are filled. Generally, the oxidizing atmosphere will comprise at least one of $O_2$, $O_3$, $H_2O$, $N_2O$, $H_2O_2$, etc. present as a mixture in an inert gas such as $N_2$ or Ar, etc.

In the next step, the second electrode, 406, is formed on dielectric layer, 404. The second electrode layer may be a conductive binary metal compound material as described above, a metal, or a combination thereof.

In the next step, the DRAM capacitor stack, 400, would then be annealed (PMA treatment) to crystallize the second electrode and ensure that the oxidation state of the dielectric material is not compromised and that any oxygen vacancies ($V_{ox}$) are filled. If the second electrode is a conductive metal oxide, the atmosphere will be oxidizing and will comprise at least one of $O_2$, $O_3$, $H_2O$, $N_2O$, $H_2O_2$, etc. present as a mixture in an inert gas such as $N_2$ or Ar, etc. If the second electrode is a metal or a conductive metal nitride, the atmosphere will be an inert gas such as $N_2$ or Ar.

In one example of the present invention, a first electrode comprising between about 5 nm to about 10 nm of TiN is formed on a substrate. The TiN electrode material is formed using an ALD or CVD process technology. The TiN electrode material receives an RTA treatment with nitrogen. The substrate with the first electrode is then optionally annealed. A dielectric layer is then formed on top of the annealed first electrode. The dielectric layer comprises between about 5 nm to about 10 nm of $ZrO_2$. Optionally, the $ZrO_2$ material is doped with ($Al_2O_3$) at a concentration between about 1% and about 30% ($Al_2O_3$). The $ZrO_2$ dielectric layer is formed at a process temperature between about 200 C and 350 C using an ALD process technology. The substrate with the first electrode and dielectric layer is then annealed in an oxidizing atmosphere comprising between about 0% $O_2$ to about 100% $O_2$ in $N_2$ and advantageously between about 0% $O_2$ to about 20% $O_2$ in $N_2$ at temperatures between about 400 C to about 600 C for between about 1 millisecond to about 60 minutes. A second electrode is then formed on top of the dielectric layer. The second electrode comprises between about 5 nm and about 10 nm of TiN. The TiN second electrode layer is formed using an ALD process technology. The substrate with the first electrode, dielectric layer, and second electrode (i.e. a capacitor stack) is then annealed in $N_2$ at between about 400 C to about 550 C for between about 1 millisecond to about 60 minutes. The PMA treatment generally has a lower oxygen concentration to prevent oxidation of the two electrode layers.

Figure 5:
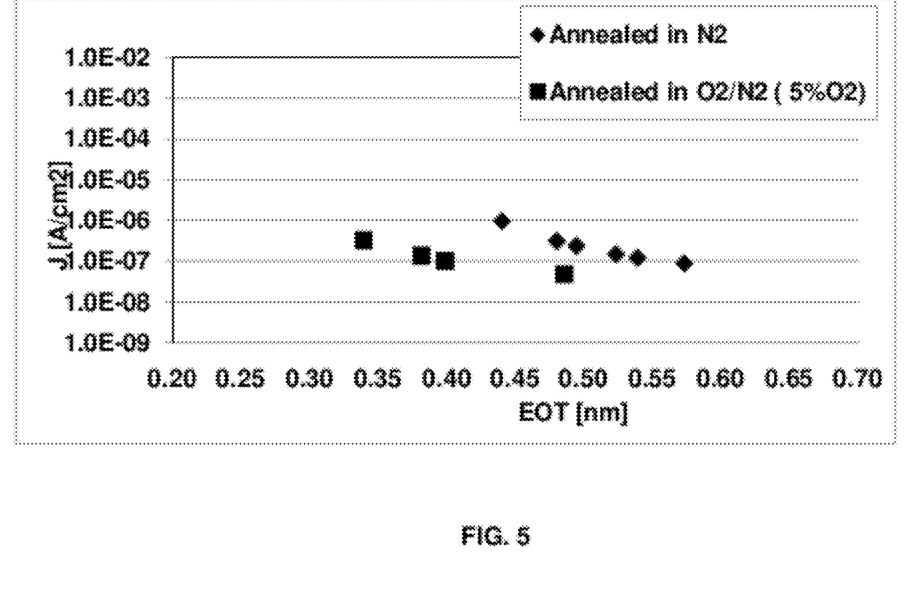
FIG. 5 presents data showing the decrease in leakage current after a PMA anneal.

FIG. 5 presents data for leakage current (J) versus EOT for a $MoO_2$/Al:$TiO_2$/Ru MIM capacitor formed using some of the steps of the present invention. The $MoO_2$ first electrode was formed on the substrate at a thickness of 20 nm and then annealed in forming gas comprising 5% $H_2$ in $N_2$ at 490 C for 10 minutes. The Al:$TiO_2$ dielectric was then formed on the annealed first electrode at a thickness of 9 nm. The Al concentration is about 10 atomic %. The dielectric layer did not receive a PDA treatment prior to the formation of the second electrode. The Ru second electrode was formed on the dielectric layer at a thickness of 50 nm. Ru was chosen as the second electrode material since it will not interact with the dielectric layer during the tests that followed. The capacitor stack then received a PMA treatment of either $N_2$ or a mixture of 5% $O_2$ in $N_2$ at 460 C for 10 minutes. The data in FIG. 5 indicate that the 5% $O_2$/$N_2$ PMA treatment results in a lower leakage current for all EOT values. The improved leakage current behavior can be attributed to a decrease in the oxygen vacancy ($V_{ox}$) concentration in the dielectric layer after the PMA treatment containing oxygen.

Figure 6:
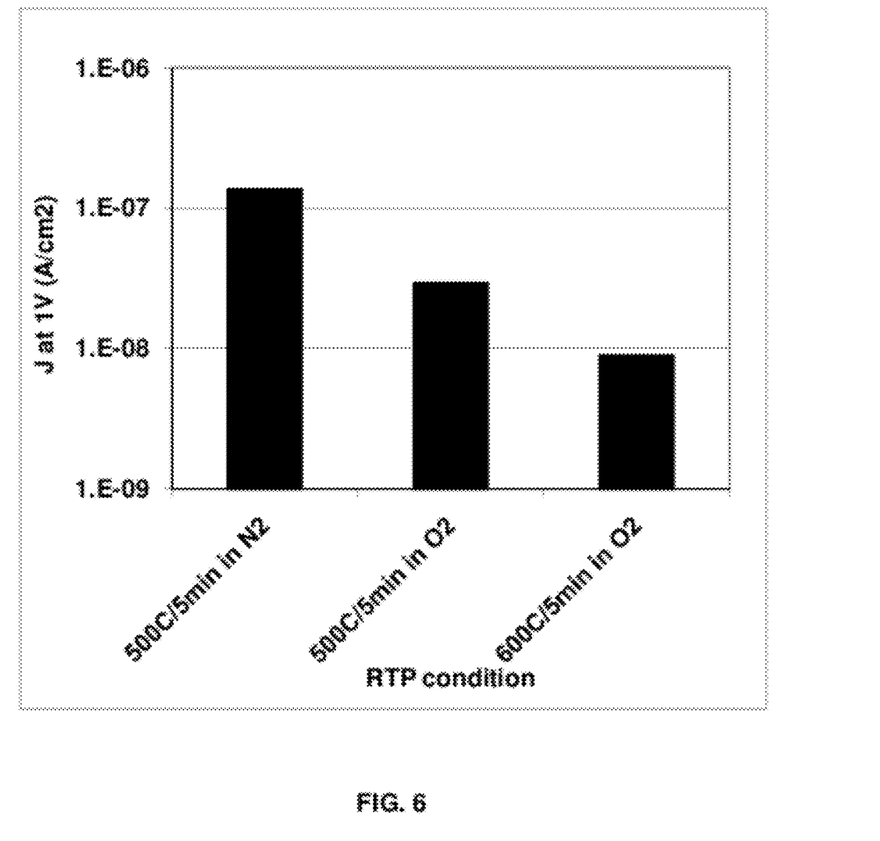
FIG. 6 presents data showing the decrease in leakage current for various annealing conditions.

FIG. 6 presents data for leakage current (J) versus PMA treatment conditions of a Pt/$ZrO_2$/Pt MIM capacitor formed using some of the steps of the present invention. This data isolates the influence of the PDA treatment by using noble metal electrodes that do not react with $O_2$ during the anneal and will not interact with the dielectric layer. The Pt first electrode was formed on the substrate at a thickness of 120 nm. The $ZrO_2$ dielectric was then formed on the first electrode at a thickness of 8 nm. The Pt second electrode was then formed on the dielectric layer at a thickness of 50 nm. The first sample then received a rapid thermal anneal (RTA) PMA treatment at 500 C $N_2$ for 5 minutes. This sample exhibited the highest leakage current. The second sample then received a rapid thermal oxidation (RTO) PMA treatment at 500 C in $O_2$ for 5 minutes. This sample exhibited lower leakage current than the RTA samples. A third sample then received a rapid thermal oxidation (RTO) PMA treatment at 600 C in $O_2$ for 5 minutes. This sample exhibited the lowest leakage current. The low leakage current is likely due to a decrease in the oxygen vacancies ($V_{ox}$) concentration in the dielectric layer after the PMA treatment containing oxygen and the removal of interface defect states created during the second electrode formation by the PMA treatment. Both the oxygen vacancies and the interface defect states would contribute to the Frenkel-Poole emission mechanism of the leakage current.

Figure 7:
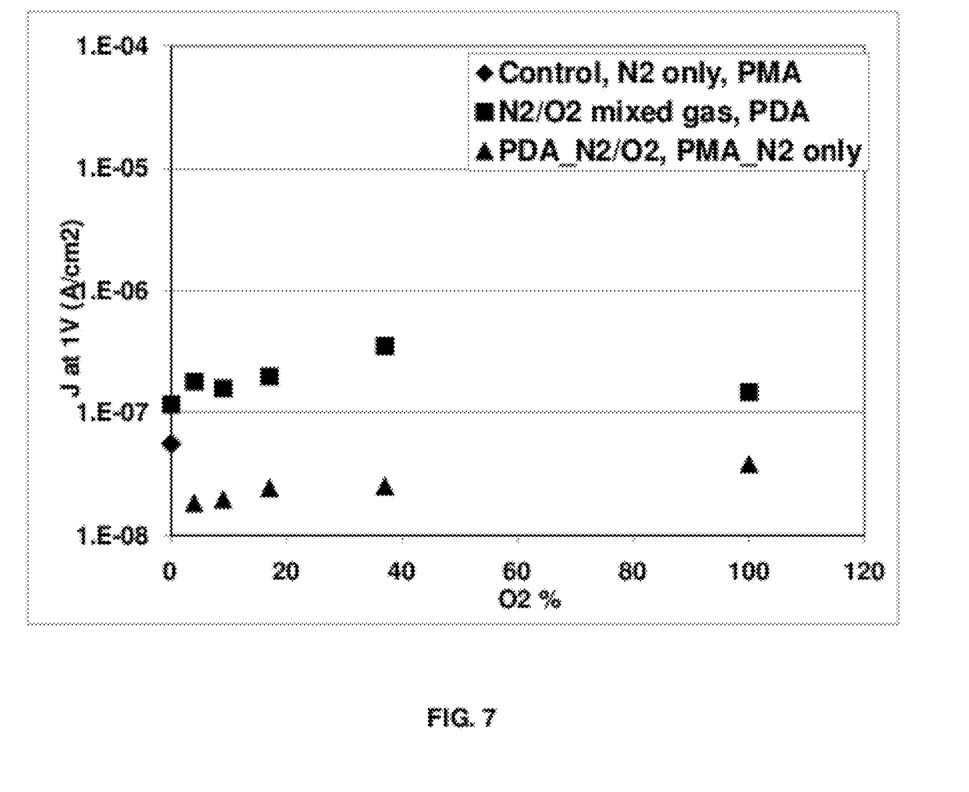
FIG. 7 presents data showing the decrease in leakage current for various annealing conditions.

FIG. 7 presents data for leakage current (J) versus $O_2$ concentration (%) during the PDA treatment of a TiN/$ZrO_2$/TiN MIM capacitor formed using some of the steps of the present invention. The TiN first electrode was formed on the substrate at a thickness of 50 nm. The TiN first electrode did not receive an additional treatment before the formation of the dielectric layer. The $ZrO_2$ dielectric was then formed on the treated first electrode at a thickness of 8 nm. The dielectric layer then received one of the following PDA treatments: a) no treatment; b) treatment in a mixture of $O_2$ in $N_2$ at 500 C for 5 minutes. The TiN second electrode was formed on the dielectric layer at a thickness of 100 nm. The control samples received only a PMA treatment in $N_2$ at 500 C for 5 minutes. The control samples did not receive a PDA treatment. A second set of samples received only a PDA treatment in a mixture of $O_2$ in $N_2$ at 500 C for 5 minutes. They did not receive a PMA treatment. The leakage current for this group of samples increased relative to the control samples. The third set of samples received both a PDA treatment in a mixture of $O_2$ in $N_2$ at 500 C for 5 minutes and a PMA treatment in $N_2$ at 500 C for 5 minutes. The PMA treatment for this capacitor stack could not include $O_2$ because it would oxidize the TiN second electrode. The third set of samples exhibited the lowest leakage current.

The low leakage current of the third set of samples was an unexpected result. Generally, a PMA only treatment is performed after the capacitor stack is formed. This final anneal is thought to remove the interface states formed during the various layer formation steps and crystallize the layers. The PMA only treatment has been effective as illustrated in FIG. 7 wherein the leakage current of the control samples was below the desired level of $10^{-7}$ A $cm^{-2}$. If oxygen is added to the PMA only anneal, the leakage current is still in the same range as the control group of samples as illustrated by the data in FIG. 5. Because of this performance, the addition of the PDA treatment was not expected to significantly lower the leakage current from the PMA only performance level. However, as illustrated in FIG. 7, the leakage current for the third set of samples is significantly lower than the PMA only control set of samples and lower than the data for PMA only treatments with oxygen presented in FIG. 5. The low leakage current observed in the third set of samples is likely due to a decrease in the oxygen vacancy ($V_{ox}$) concentration in the dielectric layer after the PDA treatment containing oxygen and the removal of interface defect states created during the second electrode formation by the PMA treatment. Both the oxygen vacancies and the interface defect states would contribute to the Frenkel-Poole emission mechanism of the leakage current. The data indicate that adding oxygen during a PMA only anneal is not as good as performing a PDA anneal prior to the formation of the second electrode.

Although various embodiments that incorporate the teachings of the present invention have been shown and described in detail herein, those skilled in the art can readily devise many other varied embodiments that still incorporate these teachings.

What is claimed is:

1. A method for producing a capacitor stack, the method comprising:
   forming a first electrode layer on a substrate
      wherein the first electrode layer comprises molybdenum oxide;
   directly after forming the first electrode layer, annealing the first electrode and the substrate in a reducing atmosphere comprising one of $N_2$ or Ar and comprising one of $H_2$ and $NH_3$,
   forming a dielectric layer on the first electrode layer,
      the dielectric layer directly interfacing the first electrode layer,
      the dielectric layer is a doped $TiO_2$,
         wherein at least 30% of the doped $TiO_2$ is in a rutile phase,
      the dielectric layer formed using atomic layer deposition at a temperature of between about 200° C. and 350° C.;
   directly after forming the dielectric layer, annealing the dielectric layer and the first electrode layer in a first oxidizing atmosphere comprising one of $O_3$, $H_2O$, $N_7O$, $H_7O_2$ and comprising one of $N_2$ or Ar
      wherein annealing the dielectric layer and the first electrode layer further oxidizes the doped $TiO_2$ and fills oxygen vacancies in the doped $TiO_2$,
      wherein the dielectric layer and the first electrode are annealed in the first oxidizing atmosphere at a temperature of at least about 500° C.;
   forming a second electrode layer on the dielectric layer; and
   directly after forming the second electrode layer, annealing the second electrode, the dielectric layer, and the first electrode in an inert atmosphere thereby crystallizing the second electrode and maintaining an oxidation state and an oxygen vacancy state of the doped $TiO_2$.

2. The method of claim 1, wherein the first oxidizing atmosphere comprises one of $O_2$ or $O_3$.

3. The method of claim 1 wherein the annealing of the dielectric layer and the first electrode occurs at a temperature of less than about 600° C.

4. The method of claim 1 wherein the annealing of the dielectric layer occurs between 1 millisecond and 60 minutes.

5. The method of claim 1 wherein the second electrode layer is a conductive metal oxide material.

6. The method of claim 5 wherein the conductive metal oxide is molybdenum oxide.

7. The method of claim 1 wherein the second electrode layer is a metal or conductive metal nitride material.

8. The method of claim 7 wherein the second electrode layer comprises at least one of Ru or TiN.

9. The method of claim 1 wherein the second electrode, the dielectric layer, and the first electrode are annealed in the inert atmosphere comprising at least one of $N_2$ or Ar.

10. The method of claim 1 wherein the second electrode, the dielectric layer, and the first electrode are annealed at a temperature between about 400° C. and about 600° C.

11. The method of claim 1 wherein the second electrode, the dielectric layer, and the first electrode are annealed for between 1 millisecond and 60 minutes.

12. The method of claim 1, wherein a dopant of the doped $TiO_2$ comprises aluminum.

13. The method of claim 1, wherein a dopant of the doped TiO$_2$ comprises aluminum oxide, and wherein a concentration of aluminum oxide in the doped TiO$_2$ is between about 5% and about 15%.

14. The method of claim 1, wherein the first oxidizing atmosphere comprises between about 0% and 20% of O$_2$ in N$_2$.

* * * * *